US008786376B2

(12) United States Patent
Voinigescu et al.

(10) Patent No.: US 8,786,376 B2
(45) Date of Patent: Jul. 22, 2014

(54) VARACTOR VOLTAGE CONTROLLED OSCILLATOR (VCO) PROVIDING INDEPENDENT COARSE AND FINE FREQUENCY TUNING

(75) Inventors: Sorin Voinigescu, Toronto (CA); Ekaterina Laksin, Thornhill (CA)

(73) Assignee: Peraso Technologies, Inc., Toronto (CA)

( * ) Notice: Subject to any disclaimer, the term of this patent is extended or adjusted under 35 U.S.C. 154(b) by 0 days.

(21) Appl. No.: 13/324,556

(22) Filed: Dec. 13, 2011

(65) Prior Publication Data
US 2013/0147566 A1 Jun. 13, 2013

(51) Int. Cl.
H03B 5/12 (2006.01)

(52) U.S. Cl.
CPC ............ *H03B 5/1218* (2013.01); *H03B 5/1231* (2013.01); *H03B 5/1253* (2013.01); *H03B 2200/0008* (2013.01)
USPC ..................... 331/117 R; 331/167; 331/177 V

(58) Field of Classification Search
CPC ...... H03B 5/1218; H03B 5/1206; H03B 5/12; H03B 5/1231; H03B 5/1253; H03B 2200/0008
USPC ........... 331/177 V, 117 FE, 36 C, 117 R, 167, 331/177 R, 34, 16
See application file for complete search history.

(56) References Cited

U.S. PATENT DOCUMENTS

| 1,624,537 | A | | 4/1927 | Colpitts | |
|---|---|---|---|---|---|
| 6,008,702 | A | * | 12/1999 | Yamamoto | 331/179 |
| 6,218,909 | B1 | * | 4/2001 | Eban | 331/117 R |
| 6,249,190 | B1 | * | 6/2001 | Rozenblit et al. | 331/46 |
| 7,863,993 | B1 | * | 1/2011 | Bohsali et al. | 331/116 FE |
| 7,956,698 | B2 | * | 6/2011 | Ishii | 331/167 |
| 2005/0030116 | A1 | * | 2/2005 | Takagi | 331/177 V |
| 2009/0085681 | A1 | * | 4/2009 | Lin et al. | 331/111 |
| 2009/0134947 | A1 | * | 5/2009 | Tarng | 331/116 FE |
| 2010/0267352 | A1 | * | 10/2010 | Fujii et al. | 455/255 |
| 2011/0267149 | A1 | * | 11/2011 | Trivedi | 331/117 R |

OTHER PUBLICATIONS

C. Lee, T. Yao, A. Mangan, K. Yau, M.A. Copeland, and S.P. Voinigescu, "SiGe BiCMOS 65-GHz BPSK Transmitter and 30 to 122 GHz LC-Varactor VCOs with up to 21% Tuning Range,", Oct. 2004, CSICS Technical Digest, pp. 179-182.*

E. Laskin, A. Tomkins, A. Balteanu, I. Sarkas and S.P. Voinigescu, "A 60-GHz RF IQ DAC Transceiver with on-Die at-Speed Loopback,", Jun. 11, 2011, IEEE Radio Frequency Integrated Circuits Symposium, RFIc 2011, pp. 1-4.*

Zirath et al., "Balanced Colpitt Oscillator MMICs Designed for Ultra-Low Phase Noise", IEEE Journal of Solid-State Circuits, vol. 40, No. 10, Oct. 2005, pp. 2077-2086.*

(Continued)

*Primary Examiner* — Ryan Johnson

(57) ABSTRACT

A voltage controlled oscillator, includes a tank circuit including an inductor having a value L, interconnected with first and second variable capacitors, having values $C_{VAR1}$ and $C_{VAR2}$, and a fixed capacitor $C_{FIXED}$, to cause oscillation of the oscillator at a controlled frequency $$f_{osc} = (2\pi)^{-1} \left( L \left\{ C_{VAR2} + \frac{C_{FIXED} C_{VAR1}}{C_{FIXED} + C_{VAR1}} \right\} \right)^{-1/2}$$

$C_{VAR1}$ controls coarse frequency tuning of the oscillator, and $C_{VAR2}$ may control fine tuning of the oscillator. The variable capacitors may be formed using accumulation-mode MOS varactors.

15 Claims, 6 Drawing Sheets

(56) References Cited

OTHER PUBLICATIONS

Soorapanth et al., "Analysis and Optimization of Accumulation-Mode Varactor for RF ICs", 1998 Symposium on VLSI Circuits Digest of Technical Papers, 1998, pp. 32-33.*

H.R. Pota, Analysis of Common-Collector Colpitts Oscillator, May 20, 2005.

I. Sarkas, E. Laskin, J. Hasch, P. Chevalier, and S.P. Voinigescu, "Second Generation Transceivers for D-Band Radar and Data Communication Applications," IEEE MTT-S Int. Microwave Symposium (IMS) 2010, Anaheim CA, USA, May 2010.

C. Lee, T. Yao, A. Mangan, K. Yau, M.A. Copeland, and S.P. Voinigescu, "SiGe BiCMOS 65-GHz BPSK Transmitter and 30 to 122 GHz LC-Varactor VCOs with up to 21% Tuning Range," CSICS Technical Digest, pp. 179-182, Oct. 2004.

K.W. Tang, S. Leung, N. Tieu, P.Schvan, S.P. Voinigescu, "Frequency Scaling and Topology Comparison of Millimeter-wave CMOS VCOs," IEEE CSICS, pp. 55-58, Nov. 2006.

Timothy O. Dickson and Sorin P. Voinigescu, "SiGe BiCMOS Topologies for Low-Voltage Millimeter-Wave Voltage Controlled Oscillators and Frequency Dividers," SiGe Monolithic ICs in RF Sys. Digest, 2005, pp. 273-276.

Miles A. Copeland, Sorin P. Voinigescu, David Marchesan, Petre Popescu and Michael C. Caliepaard, "5-GHz SiGe HBT Monolithic Radio Transceiver with Tunable Filtering," IEEE Transactions on Microwave Theory and Techniques, vol. 48, No. 2, Feb. 2000.

S.P. Voinigescu, D. Marchesan, and M.A. Copeland, "A Family of Monolithic Inductor-Varactor SiGe-HBT VCOs For 20 GHz to 30 GHz LMDS and Fiber-Optic Receiver Applications," in Proc. Radio Frequency Integrated Circuits Symp., Jun. 2000, pp. 173-176.

Nils Pohl, Hans-Martin Rein, Thomas Musch, Klaus Aufinger and Josef Hausner, "SiGe Bipolar VCO with Ultra-Wide Tuning Range at 80 GHz Center Frequency," IEEE Journal of Solid-State Circuits, vol. 44, No. 10, Oct. 2009.

E. Laskin, A. Tomkins, A. Balteanu, I. Sarkas and S.P. Voinigescu, "A 60-GHz RF IQ DAC Transceiver with on-Die at-Speed Loopback," IEEE Radio Frequency Integrated Circuits Symposium, RFIC 2011, pp. 1-4.

Prof. Ali M. Niknejad, "EECS 143—Integrated Circuits for Communication, Lecture 23: Negative Resistance Osc, Differential Osc, and VCOs," University of California, Berkeley, 2005.

Prof. Ali M. Niknejad, "EECS 143—Integrated Circuits for Communication, Lecture 24: Oscillator Phase Noise," University of California, Berkeley, 2005.

Nicolson et al., "Design and Scaling of W-Band SiGe BiCMOS VCOs", 2007, Journal of Solid-State Circuits, vol. 42, No. 9.

Pohl et al., "An 80 GHz SiGe Bipolar VCO with Wide Tuning Range Using Two Simultaneously Tuned Varactor Pairs", 2008, IEEE.

Voinigescu et al., "Silicon D-Band Wireless Transceivers and Applications", Microwave Conference Proceedings (APMC), 2010 Asia-Pacific.

\* cited by examiner

VARACTOR VOLTAGE CONTROLLED OSCILLATOR (VCO) PROVIDING INDEPENDENT COARSE AND FINE FREQUENCY TUNING

FIELD OF THE INVENTION

The present invention relates generally to oscillator circuits, and more particularly to voltage controlled oscillator circuits that allow for fine and coarse tuning.

BACKGROUND OF THE INVENTION

A variety of oscillator circuits are known. Examples include the Colpitts oscillator as described in U.S. Pat. No. 1,624,537, the contents of which are hereby incorporated by reference. A Colpitts oscillator uses a "tank" circuit having an inductance with two capacitors that determine the frequency of oscillation. The feedback signal to drive the oscillator is taken from a voltage divider made of the two capacitors, connected in series.

Another example oscillator is the Clapp oscillator. The Clapp oscillator is basically a Colpitts oscillator that has an additional capacitor placed in series with the inductor.

Many applications use oscillators for tuning purposes. As such, Clapp and Colpitts oscillators are often formed as variable frequency oscillators, whose frequencies of oscillation are controlled using variable capacitors, whose capacitance(s) vary with an applied control voltage. Such oscillators are referred to as voltage controlled oscillators (VCOs).

In variable frequency, radio applications a Colpitts VCO is often preferred because of its relatively low phase noise.

Nevertheless, to tune a relatively wide frequency range, requires a capacitor having significant variability, and/or relatively large VCO control voltages. In many micro-electric and integrated circuits, required voltages and variable capacitors of such size and range are not available or impractical.

Accordingly, there is a need for an improved VCO that provides a relatively wide tuning range, with a desired precision, while using components that may be integrated and whose size may be limited for certain desired frequency ranges.

SUMMARY OF THE INVENTION

In accordance with an aspect of the present invention, there is provided a voltage controlled oscillator, comprising: a transistor; a tank circuit interconnecting the transistor in feedback, the tank circuit including an inductor having a value L, interconnected with first and second variable capacitors, having values $C_{VAR1}$ and $C_{VAR2}$, and a fixed capacitor $C_{FIXED}$, to cause oscillation of the oscillator at a controlled frequency $$f_{osc} = (2\pi)^{-1}\left(L\left\{C_{VAR2} + \frac{C_{FIXED}C_{VAR1}}{C_{FIXED} + C_{VAR1}}\right\}\right)^{-1/2}$$

wherein adjustment of $C_{VAR1}$ and $C_{VAR2}$ control tuning of the oscillator.

In accordance with another aspect of the present invention, there is provided a method of producing an oscillating voltage at a desired frequency, comprising: providing a transistor; providing a tank circuit interconnecting the transistor in feedback, the tank circuit including an inductor having a value L, interconnected with first and second variable capacitors, having values $C_{VAR1}$ and $C_{VAR2}$, and a fixed capacitor $C_{FIXED}$, to cause oscillation of the transistor at a controlled frequency $$f_{osc} = (2\pi)^{-1}\left(L\left\{C_{VAR2} + \frac{C_{FIXED}C_{VAR1}}{C_{FIXED} + C_{VAR1}}\right\}\right)^{-1/2}$$

adjusting $C_{VAR1}$ and $C_{VAR2}$ to cause oscillation at the desired frequency.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
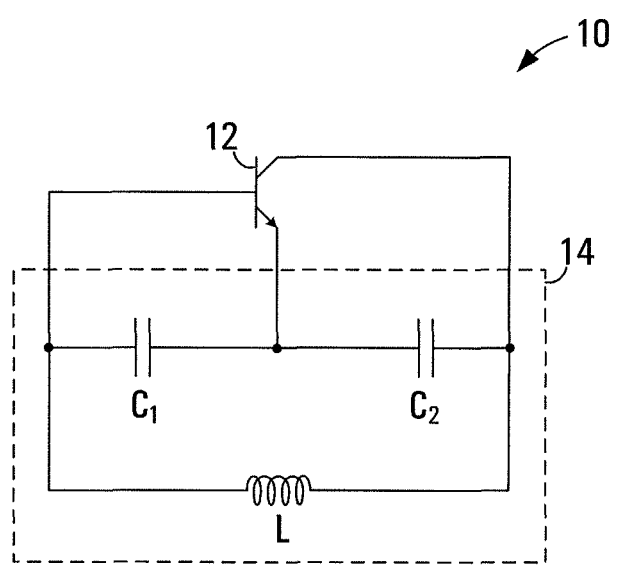
FIG. 1 is a schematic diagram of a conventional Colpitts oscillator circuit.

FIG. 1 is a simplified schematic diagram of a Colpitts oscillator 10. As illustrated, a transistor 12 is interconnected with a tank circuit 14. Analysis of this circuit is detailed in *Analysis of Common-Collector Colpitts Oscillator*. H R Pota. May 20, 2005, the contents of which are hereby incorporated by reference. As shown therein, the frequency of oscillation may be closely approximated as the resonant frequency of the tank circuit 14, namely $$1/f_{osc} = 2\pi\sqrt{L\left\{\frac{C_1 C_2}{C_2 + C_2}\right\}} \qquad (1)$$

Unfortunately, the frequency range of operation of the circuit of FIG. 1 is practically limited by the available sizes of $C_1$ and $C_2$. This is particularly so, where the circuit of FIG. 1 is formed on an integrated circuit that is miniaturized.

Figure 2A:
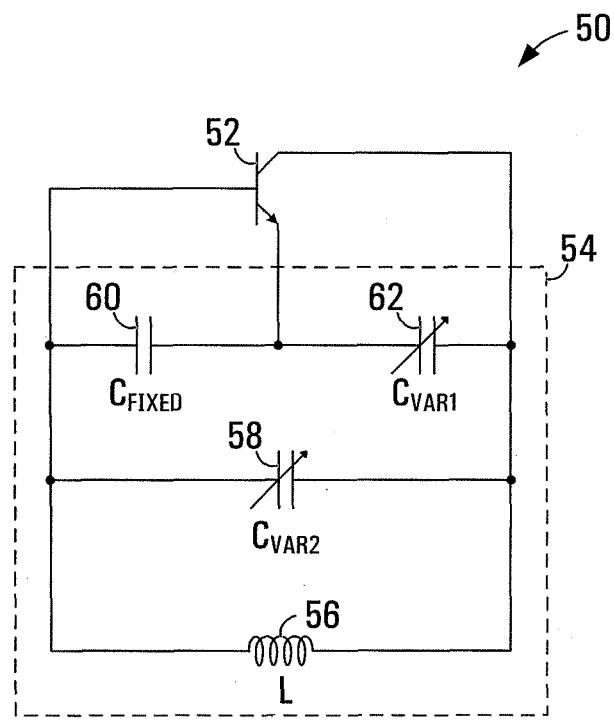
FIGS. 2A and 2B are simplified schematic diagrams of a VCO circuit, exemplary of embodiments of the present invention.

FIG. 2A is a therefore a schematic diagram of a VCO circuit 50, that allows for more flexible frequency tuning, exemplary of an embodiment of the present invention. Circuit 50 includes a transistor 52, interconnected with tank circuit 54. Tank circuit 54 includes an inductor 56 interconnected in parallel with a capacitor $C_{VAR2}$ 58. Inductor 56 is further interconnected in parallel with two series capacitors $C_{FIXED}$, $C_{VAR1}$ 60, 62. $C_{FIXED}$ and $C_{VAR1}$ 60, 62 provide a voltage divider, interconnecting the transistor 52 in feedback.

It may be shown that the oscillation frequency of VCO circuit 50 may be determined by $$1/f_{osc} = 2\pi \sqrt{L \left\{ C_{var2} + \frac{C_{fixed} C_{var1}}{C_{fixed} + C_{var1}} \right\}}$$ (2)

Of note, this oscillation frequency substantially equals the resonant frequency of the tank circuit 54. Both $C_{VAR1}$ and $C_{VAR2}$ may be used to tune VCO circuit 50 to a frequency of interest. This allows for greater tuning flexibility of VCO circuit 50, particularly when the values of $C_{VAR1}$ and $C_{VAR2}$ are constrained, for example by size.

Figure 2B:
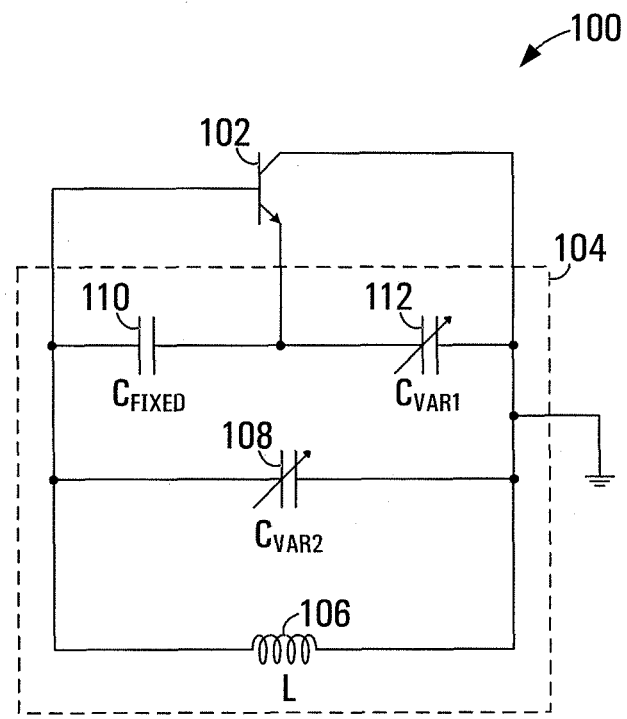

FIG. 2B is a further schematic diagram of a VCO circuit 100, exemplary of an embodiment of the present invention. As illustrated VCO circuit 100 includes a bipolar junction transistor 102 connected in a common collector configuration to tank circuit 104. As illustrated, the collector of transistor 102 is connected to ground, and its base is connected to ground through a parallel inductor L 106 and capacitor $C_{VAR2}$ 108 of tank circuit 104. A further static capacitor $C_{FIXED}$ 110 connects the base to the emitter. The emitter is further coupled to ground through a variable capacitor $C_{VAR1}$ 112. Inductor, L 106, $C_{FIXED}$ 110, $C_{VAR2}$, $C_{VAR1}$ 108, 112 thus form tank circuit 104 for VCO circuit 100 providing a frequency of oscillation as set out in equation (2), supra.

Two separate variable capacitors, $C_{VAR2}$ and $C_{VAR1}$ allow VCO circuit 100 to achieve a broad range of frequencies that may be tuned with precision. In particular, $C_{VAR1}$ may be used for coarse frequency tuning, while $C_{VAR2}$ may be used for fine tuning.

Figure 3:
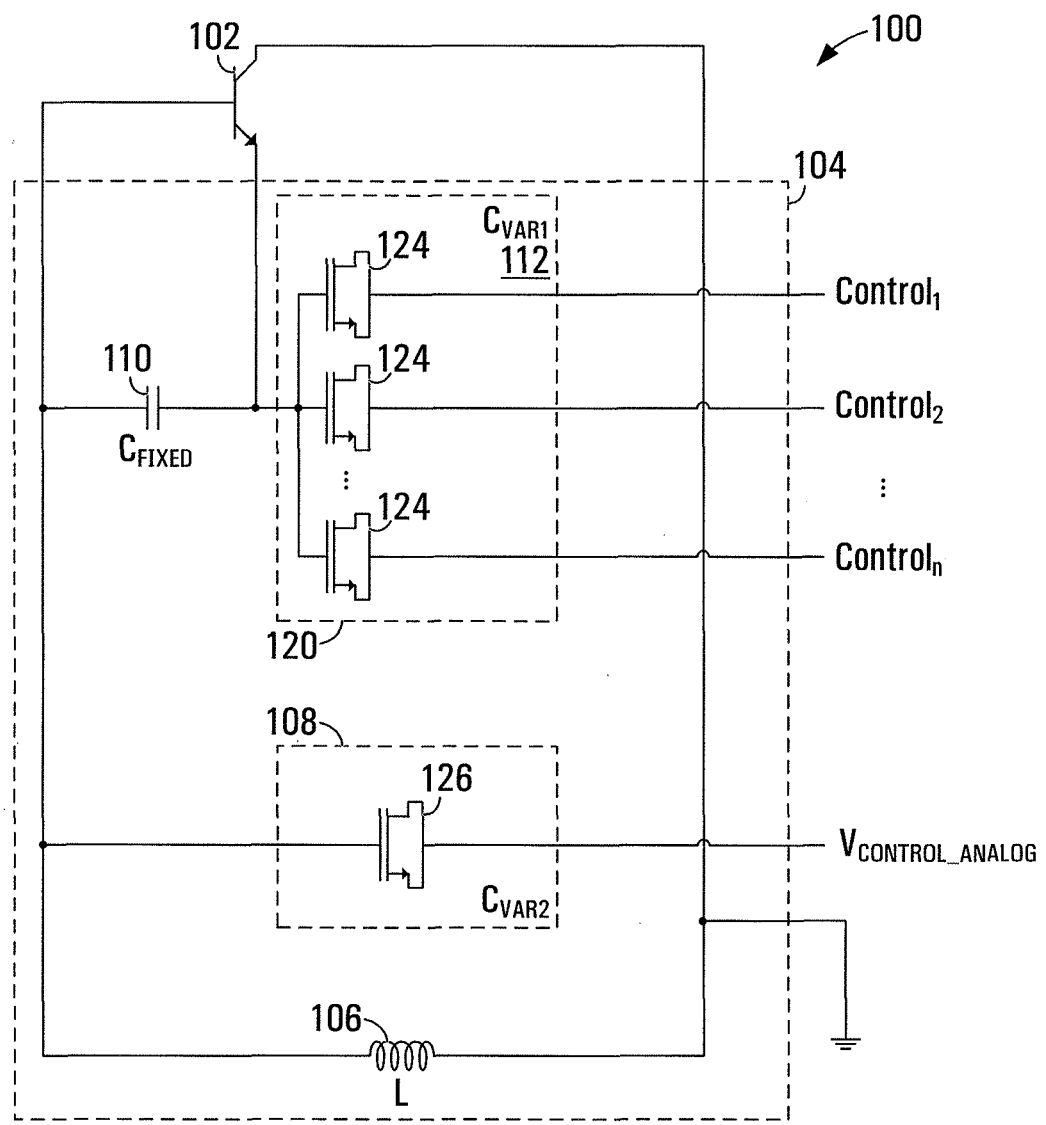
FIG. 3 is further schematic diagram of the VCO circuit of FIG. 2B.

To that end, FIG. 3 schematically illustrates the circuit of FIG. 2B, in which $C_{VAR1}$ 112 is a formed by a bank 120 of multiple tuneable capacitors 124, arranged in parallel. Capacitors 124 are connected in parallel, while $C_{VAR1}$ 112 is also formed as a tuneable capacitor. The capacitance of each capacitor 124 may be adjusted, through an applied voltage, $CONTROL_j$.

Each of capacitors 124 of $C_{VAR1}$ may be formed in numerous ways, for example as varactor diodes, varactor transistors or other tuneable variable capacitors. Practically, as illustrated in FIG. 3, each capacitor 124 may be formed as a varactor transistor, whose capacitance is controlled through an applied voltage. Specifically, an applied analog control voltage $CONTROL_j$ will control the effective capacitance of the $i^{th}$ varactor transistor/capacitor 124 forming bank 120.

To further simplify overall control, the control voltages applied to each node may be chosen as 0 or a fixed control voltage $V_{CONTROL}$. In this way each capacitor 124 in bank 120 will assume one of two values—one with $CONTROL_j=0$, the other with $CONTROL_j=V_{CONTROL}$. The number of possible values for $C_{VAR1}$ 112 will therefore depend on the number, n, of capacitors 124 used, and the capacitance of each capacitor 124 (as dictated by the varactor used to form that capacitor). As capacitors 124 are effectively connected in parallel, their capacitance will sum. Theoretically, for n capacitors 124, each formed as varactor, and two possible control voltages applied to $CONTROL_j$, $2^{n-1}$ capacitance values for bank 120 are possible. However, if the varactors are identical, n values for bank 120 will be possible.

As further illustrated in FIG. 3, $C_{VAR2}$ 106 may also be formed as a varactor transistor 126. An analog voltage $V_{CONTROL\_ANALOG}$ may control the effective capacitance of transistors 126.

Then, coarse frequency tuning may be effected through insertion of capacitors 124 of bank 120 defining $C_{VAR1}$ 112 using binary control signals $CONTROL_j$, while fine tuning may be accomplished by varying analog control voltage $V_{CONTROL\_ANALOG}$, and thus the value of $C_{VAR2}$.

As may now be appreciated, VCO circuit 100 has been illustrated as a common collector bipolar junction transistor (BJT) oscillator. However, tank circuit 104 suitably modified, may be used in numerous oscillators, including for example BJT oscillators connecting in common emitter or common base configurations. Likewise tank circuit 104 may be used with FET oscillators. As well, tank circuit 104 may be used in differential oscillators.

Figure 4:
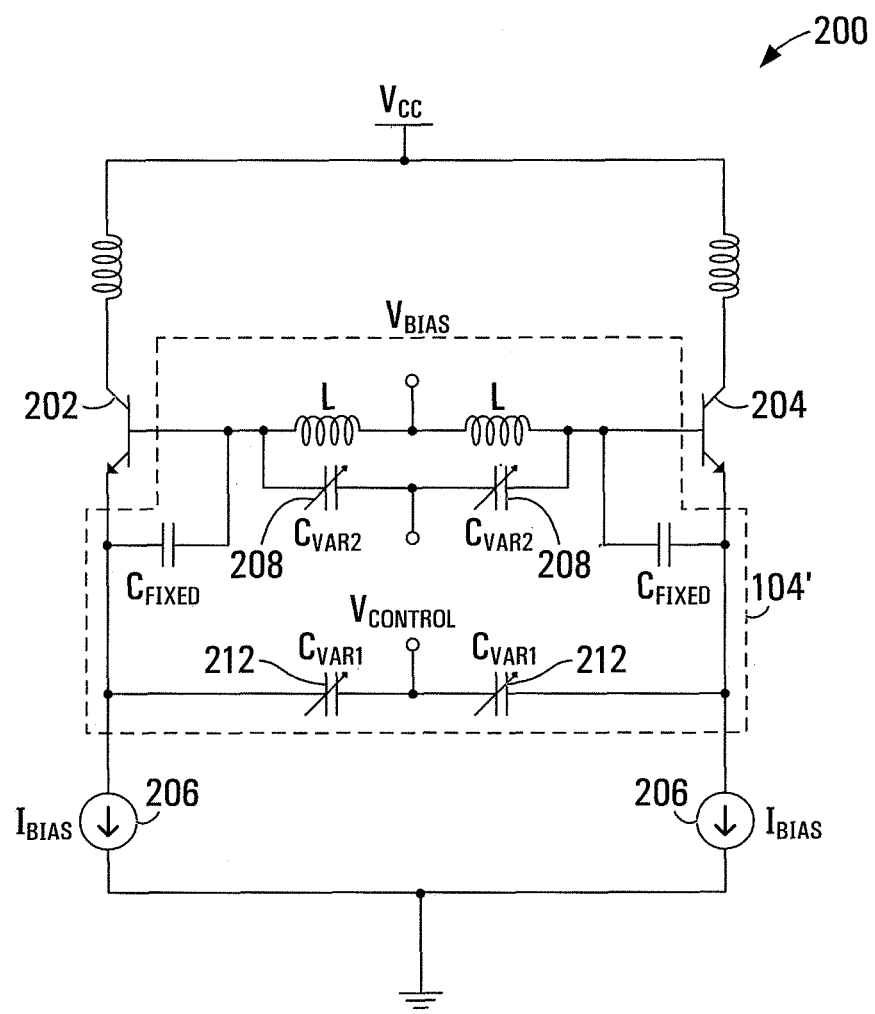
FIGS. 4, 5 and 6 are schematic diagrams of differential VCO circuits, exemplary of embodiments of the present invention.

To that end, a further differential VCO circuit 200 embodying tank circuit 104' providing coarse and variable frequency control, in the manner described above, is depicted in FIG. 4. Here two single transistor VCOs, formed of bipolar junction transistor 202, 204 are arranged in differential mode, back to back.

Each transistor 202, 204 is connected with capacitor $C_{FIXED}$ connecting its base to its emitter. A variable capacitor of tank 104' governs the value of $C_{VAR2}$ 208 for both transistor 202, 204 of both VCOs. Likewise, a common capacitor controls the value of $C_{VAR1}$ 212 for transistors 202, 204 both VCOs.

The frequency of oscillation of VCO circuit 200 is governed by equation (2). Coils of value L connected to the base of transistors 202, 204 provide the inductance value L. Current sources 206 along with a bias to the base of transistors 202, 204 power oscillator 200.

Figure 5:
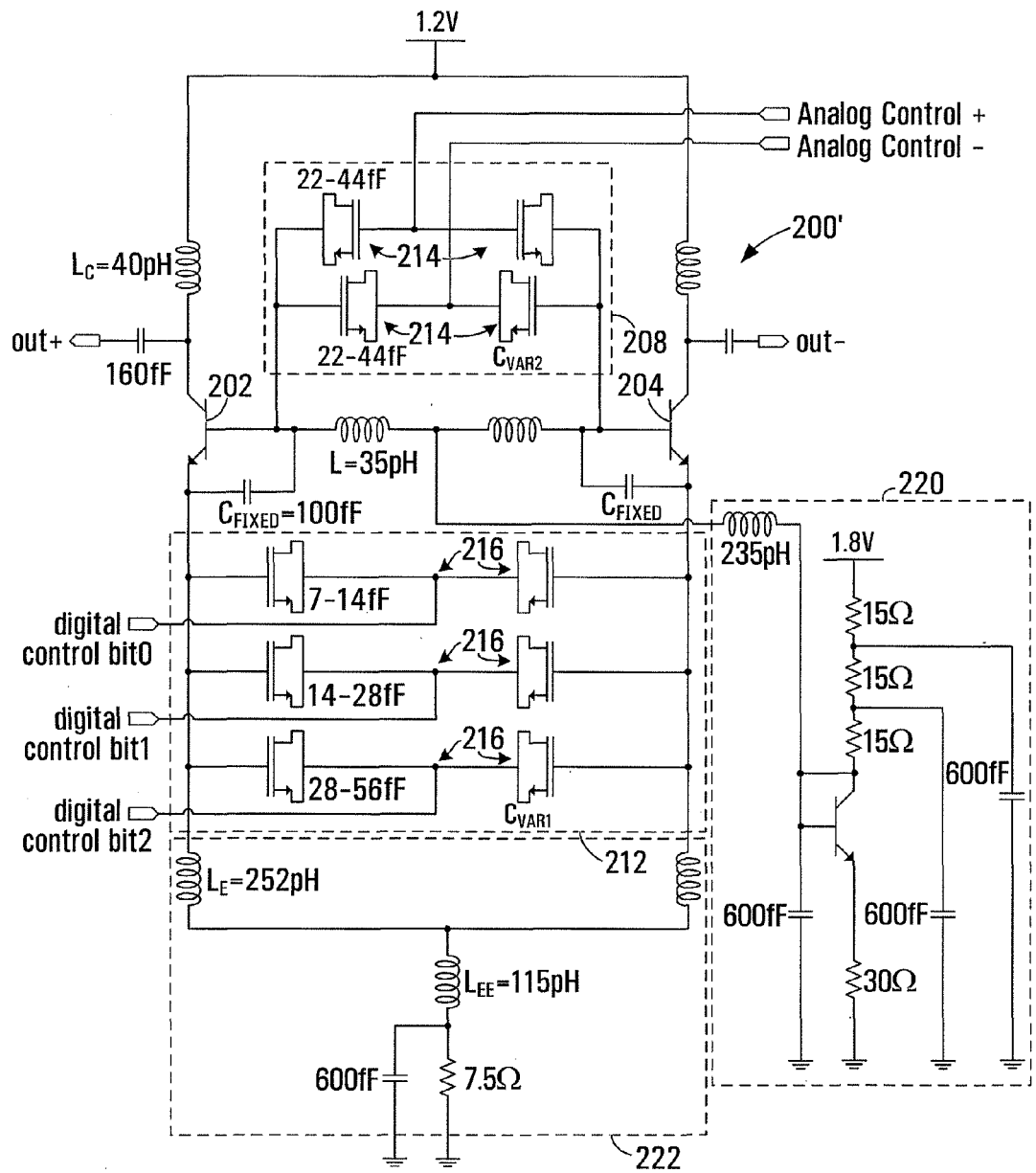

FIG. 5 illustrates a further specific VCO circuit 200', like VCO circuit 200. In VCO circuit 200', $C_{VAR2}$ 208 is formed using back-to-back varactor transistors 214, and $C_{VAR1}$ 212 may be formed as a bank of back-to-back transistor pairs 216. The node between each transistor in the pair is connected to virtual ground, as a result of the differential configuration of VCO circuit 200.

The bank forming $C_{VAR1}$ 212 includes three MOS varactor pairs 216 (although more varactor pairs could be used). An applied control voltage DIGITAL$_{13}$ CONTROL_BIT_0, DIGITAL_CONTROL_BIT_1, DIGITAL_CONTROL_BIT_2, having a defined value will insert a respective capacitance of a varactor pair 214 into the bank forming $C_{VAR1}$ 212. In the depicted embodiment, the values of varactor pairs 214 differ from each other, with one having a value CBASE=7 or 14 fF; the second having a value of 2*CBASE=14 to 28 fF; and the third having a value of 4*CBASE=28 to 56 fF. With values so chosen, eight (8) values of $C_{VAR1}$ may be selected, having total capacitance between 7*$C_{BASE}$ (49 fF) and 14*$C_{BASE}$ (98 fF).

Current source 206 (illustrated in FIG. 4) may be formed as a current mirror 220, and passive components 222.

The net capacitance of the two sets of varactors that form $C_{VAR2}$ 208 is controlled by a differential analog signal applied, ANAOG CONTROL+, and ANALOG_CONTROL- applied respectively to nodes between each varactor pair 214. In the depicted embodiment, the capacitance of each varacator pair 214 may be adjusted continuously between 22 fF and 44 fF, allowing CVAR2 to assume a value between 22 fF and 88 fF.

Of note, the applied differential analog signal control further reduces VCO phase noise of VCO circuit 200'. Varactors 214 are conveniently placed at the base node of transistors 202, 204 (and not at their emitters), whose voltage may also be close to the centre voltage of an external control source, such as a PLL charge pump, thereby extending the usable voltage control range of the VCO circuit 200'.

VCO circuit 200' is biased with a current mirror 220 from a 1.8V source. Transistors 202, 204 may be formed as SiGe heterojunction bipolar transistors. Accumulation-mode MOS varactors may be used as varactors in varactor pairs 216 forming $C_{VAR1}$ 212, and as varactors in varactor pairs 214 forming $C_{VAR2}$ 208. Example component values are also illustrated in FIG. 5. These component values are selected to tune the VCO circuit 200' to a center frequency of around 60 GHz. The tunable bandwidth of VCO circuit 200' with the specified components is about +/−4 GHz In the depicted embodiment of FIG. 5, the applied analog fine tune voltage causes the oscillation frequency of VCO circuit 200' to vary up to 1.5 to 2 GHz. At the same time, each increment of $C_{VAR1}$ controls the frequency of oscillation by 2 GHz.

Choice of appropriate components such as the accumulation-mode MOS varactors, allow the supply voltage for VCO circuit 200 to be kept low. As noted, the frequency tuning is split into coarse digital controls for $C_{VAR1}$ and fine analog control for $C_{VAR2}$. The digital controls perform frequency band selection; the control voltages (DIGITAL_CONTROL_BIT_i) are single-ended and are fixed at either ground or at the supply voltage of 1.2V using CMOS inverters. The analog control performs fine frequency tuning within the selected band.

The dual tuning allows the VCO circuit 200' to operate from a low supply voltage of only 1.2V without extra current, thus reducing the power consumption.

As well, VCO circuit 200' may be formed as a single integrated circuit, with all of the aforementioned components, or a subset thereof formed on-chip.

Figure 6:
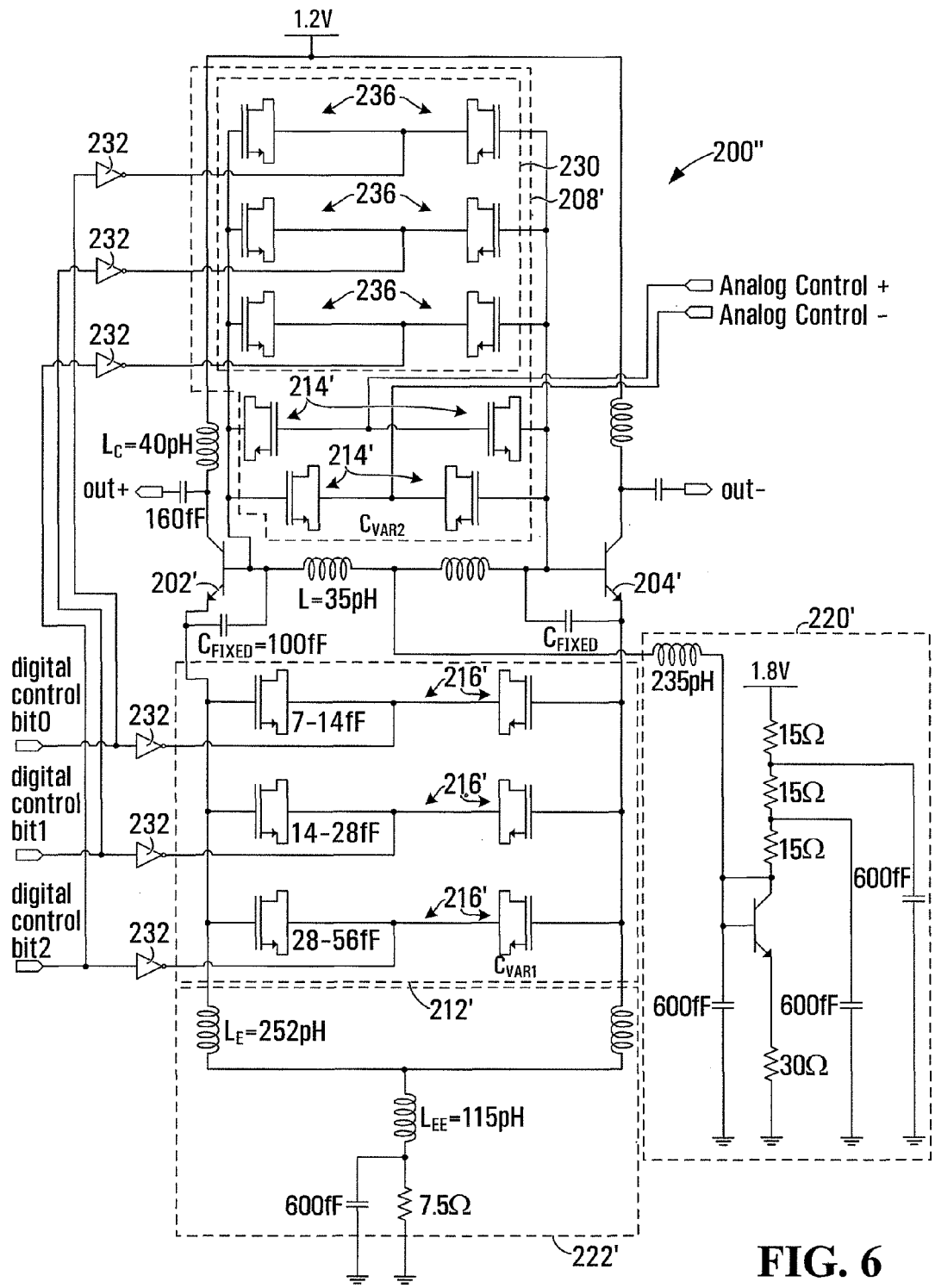

In an alternate embodiment depicted in FIG. 6, VCO circuit 200' may be further modified to add additional capacitance to $C_{VAR2}$ capacitor to form VCO circuit 200''. In particular $C_{VAR2}$ 208' may be formed a bank, including varactor pairs 214' (like varactor pairs 214 of $C_{VAR2}$ 208—FIG. 5), in parallel with additional varactor pairs 236. This provides additional range to the value of $C_{VAR2}$ 208''.

To simplify control, each varactor pair 236 may be controlled with the same control voltage used to control a varactor pair 216 of $C_{VAR1}$. The value of each varactor pair 236 may take on one of two states, depending on the presence of absence of a control voltage at DIGITAL_CONTROL_BIT$_{13}$ i. CMOS inverter/followers 232 may be interposed between the control voltage source and the varactor pair 236 and varactor pair 216. So arranging $C_{VAR2}$ and $C_{VAR1}$ allows for an even greater range of capacitance values of $C_{VAR2}$ and greater range of frequencies to which VCO circuit 200'' may be tuned.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A voltage controlled oscillator, comprising:

a transistor;

a tank circuit interconnecting said transistor in feedback, said tank circuit including an inductor having a value L, interconnected with first and second variable capacitors, having values $C_{VAR1}$ and $C_{VAR2}$, and a fixed capacitor $C_{FIXED}$, to cause oscillation of said oscillator at a controlled frequency $$f_{osc} = (2\pi)^{-1}\left(L\left\{C_{VAR2} + \frac{C_{FIXED}C_{VAR1}}{C_{FIXED} + C_{VAR1}}\right\}\right)^{-1/2}$$

wherein adjustment of $C_{VAR1}$ and $C_{VAR2}$ control tuning of said oscillator, wherein said first variable capacitor and said fixed capacitor form a voltage divider, and wherein a node in said voltage divider interconnecting said first variable capacitor and said fixed capacitor provides feedback to said transistor;

wherein said first variable capacitor $C_{VAR1}$ is formed as a bank of parallel variable capacitors, the capacitance of each of which may be selectively adjusted by a control signal;

wherein each capacitor of said bank of parallel variable capacitors is formed as two back-to-back connected MOS varactors.

2. The voltage controlled oscillator of claim 1, wherein $C_{VAR1}$ controls coarse frequency tuning of said oscillator, and wherein $C_{VAR2}$ controls fine tuning of said oscillator.

3. The voltage controlled oscillator of claim 1, wherein said second variable capacitor is formed of two back-to-back connected MOS varactors.

4. The voltage controlled oscillator of claim 3, wherein a capacitance of said second variable capacitor is controlled by an analog voltage applied to a node connecting said two back-to-back MOS varactors.

5. The voltage controlled oscillator of claim 1, wherein the capacitance of each capacitor of said bank is controlled using a binary control signal applied to a node connecting respective two back-to-back MOS varactors.

6. The voltage controlled oscillator of claim 1, wherein said transistor is a heterojunction transistor.

7. The voltage controlled oscillator of claim 1, wherein said fixed capacitor is connected between a base and emitter of said transistor.

8. The voltage controlled oscillator of claim 1, wherein said transistor is connected in common collector.

9. The voltage controlled oscillator of claim 1, wherein first and second variable capacitors are formed using accumulation-mode MOS varactors.

10. The voltage controlled oscillator of claim 1, further comprising
a second transistor, and wherein said transistor and said second transistor are connected to provide a differential output signal.

11. The voltage controlled oscillator of claim 1, wherein said second variable capacitor $C_{VAR2}$ further comprises an additional bank of parallel variable capacitors, the capacitance of each of which may be selectively adjusted by a control signal.

12. The voltage controlled oscillator of claim 11, wherein a control signal used to control capacitance of a capacitor in said bank of capacitors forming said first variable capacitor further controls capacitance of a capacitor said additional bank of parallel variable capacitors of said second variable capacitor.

13. A method of producing an oscillating voltage at a desired frequency, comprising:

providing a transistor;

providing a tank circuit interconnecting said transistor in feedback, said tank circuit including an inductor having a value L, interconnected with first and second variable capacitors, having values $C_{VAR1}$ and $C_{VAR2}$, and a fixed capacitor $C_{FIXED}$, to cause oscillation of said transistor at a controlled frequency $$f_{osc} = (2\pi)^{-1}\left(L\left\{C_{VAR2} + \frac{C_{FIXED}C_{VAR1}}{C_{FIXED} + C_{VAR1}}\right\}\right)^{-1/2}$$

adjusting $C_{VAR1}$ and $C_{VAR2}$ to cause oscillation at said desired frequency, wherein said first variable capacitor and said fixed capacitor form a voltage divider, and wherein a node in said voltage divider interconnecting said first variable capacitor and said fixed capacitor provides feedback to said transistor;

wherein said first variable capacitor $C_{VAR1}$ is formed as a bank of parallel variable capacitors, the capacitance of each of which may be selectively adjusted by a control signal;

wherein each capacitor of said bank of parallel variable capacitors is formed as two back-to-back connected MOS varactors.

14. The method of claim 13, wherein $C_{VAR1}$ controls coarse frequency tuning of said oscillator, and wherein $C_{VAR2}$ controls fine tuning of said oscillator.

15. A voltage controlled oscillator, comprising:

a transistor;

a tank circuit interconnecting said transistor in feedback, said tank circuit including an inductor having a value L, interconnected with first and second variable capacitors, having values $C_{VAR1}$ and $C_{VAR2}$, and a fixed capacitor $C_{FIXED}$, to cause oscillation of said oscillator at a controlled frequency $$f_{osc} = (2\pi)^{-1}\left(L\left\{C_{VAR2} + \frac{C_{FIXED}C_{VAR1}}{C_{FIXED} + C_{VAR1}}\right\}\right)^{-1/2}$$

wherein adjustment of $C_{VAR1}$ and $C_{VAR2}$ control tuning of said oscillator, wherein said first variable capacitor and said fixed capacitor form a voltage divider, and wherein a node in said voltage divider interconnecting said first variable capacitor and said fixed capacitor provides feedback to said transistor;

wherein said first variable capacitor $C_{VAR1}$ is formed as a bank of parallel variable capacitors, the capacitance of each of which may be selectively adjusted by a control signal;

wherein said second variable capacitor $C_{VAR2}$ further comprises an additional bank of parallel variable capacitors, the capacitance of each of which may be selectively adjusted by a control signal;

wherein a control signal used to control capacitance of a capacitor in said bank of capacitors forming said first variable capacitor further controls capacitance of a capacitor in said additional bank of parallel variable capacitors of said second variable capacitor.

* * * * *